(12) United States Patent
Clark et al.

(10) Patent No.: US 7,994,064 B2
(45) Date of Patent: Aug. 9, 2011

(54) SELECTIVE ETCH FOR DAMAGE AT EXFOLIATED SURFACE

(75) Inventors: Mark H. Clark, Santa Clara, CA (US); S. Brad Herner, San Jose, CA (US); Mohamed M. Hilali, Sunnyvale, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 115 days.

(21) Appl. No.: 12/484,271

(22) Filed: Jun. 15, 2009

(65) Prior Publication Data

US 2010/0317145 A1    Dec. 16, 2010

(51) Int. Cl.
*H01L 21/302* (2006.01)

(52) U.S. Cl. ......... 438/705; 438/753; 438/766; 438/411

(58) Field of Classification Search .................. 438/411, 438/705

See application file for complete search history.

(56) References Cited

U.S. PATENT DOCUMENTS

| 6,146,979 A | 11/2000 | Henley et al. |
| 2007/0277874 A1 | 12/2007 | Dawson-Elli et al. |
| 2008/0070340 A1 | 3/2008 | Borrelli et al. |
| 2008/0124938 A1 * | 5/2008 | Abbadie ................ 438/753 |

FOREIGN PATENT DOCUMENTS

WO    WO 9852216 A1 * 11/1998

OTHER PUBLICATIONS

Nishimoto et al., "Investigation of Acidic Texturization for Multicrystalline Silicon Solar Cells", Journal of Electrochemical Society, 146 (2) 457-461 (1999).
John et al., "Spray Etching of Silicon in the HNO/3/HF/H2O System", J. Electrochem. Soc., vol. 140, No. 9, Sep. 1993.
Sylvia D. Hossain and Michael F. Pas, "Heated SC1 Solution for Selective Etching and Resist Particulate Removal", J. Electochem. Soc., vol. 140, No. 12, pp. 3604-3606, Dec. 1993.
Cai, et al., "Single Crystal Si Layers on Glass Formed by Ion Cutting", Journal of Applied Physics, vol. 92, No. 6, pp. 3388-3392, Sep. 2002.
Margaret W. Jenkins, "A New Preferential Etch for Defects in Silicon Crystals", J. Electrochem. Soc., vol. 124, No. 5, pp. 757-762, May 1977.
U.S. Appl. No. 12/026,530, filed Feb. 5, 2008, entitled "Method to Form a Photovoltaic Cell Comprising a Thin Lamina".

* cited by examiner

*Primary Examiner* — Ajay K Arora
(74) *Attorney, Agent, or Firm* — The Mueller Law Office, P.C.

(57) ABSTRACT

Ions are implanted into a silicon donor body, defining a cleave plane. A first surface of the donor body is affixed to a receiver element, and a lamina is exfoliated at the cleave plane, creating a second surface of the lamina. There is damaged silicon at the second surface, which will compromise the efficiency of a photovoltaic cell formed from the lamina. A selective etchant, having an etch rate which is positively correlated with the concentration of structural defects in silicon, is used to remove the damaged silicon at the second surface, while removing very little of the relatively undamaged lamina.

24 Claims, 6 Drawing Sheets

Embodiment of 12/026530

Embodiment of 12/026530

Embodiment of 12/026530

Embodiment of 12/026530

US 7,994,064 B2

SELECTIVE ETCH FOR DAMAGE AT EXFOLIATED SURFACE

BACKGROUND OF THE INVENTION

The invention relates to a method to remove damaged silicon from a monocrystalline silicon surface.

It is known to form a thin silicon lamina by implanting ions through a first surface into a silicon wafer, creating a plane of maximum implant damage. The wafer is bonded to a receiver element at a first surface, then, through heating, a lamina is cleaved from the silicon wafer at the previously defined plane. A second surface of the lamina is created by this cleaving step. There is damaged silicon at the newly created surface. In fabrication of some devices from this lamina, such as SOI devices, this surface may be treated by a high-temperature anneal and/or by chemical-mechanical polishing (CMP) to remove or repair this damage.

For some applications, however, these methods of repairing or removing damage may not be appropriate, cost-effective, or sufficient. There is a need, therefore, for an effective, robust, cost-effective way to remove damaged silicon from a surface created by exfoliation, or damage at a surface created by some other means.

SUMMARY OF THE PREFERRED EMBODIMENTS

The present invention is defined by the following claims, and nothing in this section should be taken as a limitation on those claims. In general, the invention is directed to a method to remove damaged silicon from the surface of a monocrystalline silicon body.

A first aspect of the invention provides for a method to remove damaged silicon at a silicon surface, the method comprising: defining a cleave plane in a substantially crystalline silicon body by implanting ions through a first surface of the silicon body; cleaving a silicon lamina from the silicon body at the cleave plane, wherein the first surface of the silicon body is a first surface of the lamina, and wherein the cleaving step creates a second surface of the silicon lamina opposite the first surface; and etching at the second surface using a selective etchant, wherein the selective etchant etches silicon at a variable rate, wherein the etch rate in silicon is positively correlated with the concentration of structural defects in the silicon.

An embodiment of the invention provides for a method to form a photovoltaic cell, the method comprising: defining a cleave plane in a substantially crystalline silicon body by implanting ions through a first surface of the silicon body; affixing the silicon body at the first surface to a receiver element, with zero, one, or more layers intervening; cleaving a silicon lamina from the silicon body at the cleave plane, wherein the first surface of the silicon body is a first surface of the lamina, and wherein the cleaving step creates a second surface of the silicon lamina opposite the first surface; etching at the second surface using a selective etchant, wherein the selective etchant etches silicon at a variable rate, wherein the etch rate in silicon is positively correlated with the concentration of structural defects in the silicon; and fabricating a photovoltaic cell, the photovoltaic cell comprising the silicon lamina.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 4a-4c and 4e are cross-sectional views, while FIG. 4d is shows the structure in plan view.

DETAILED DESCRIPTION OF THE PREFERRED EMBODIMENTS

Figure 1:
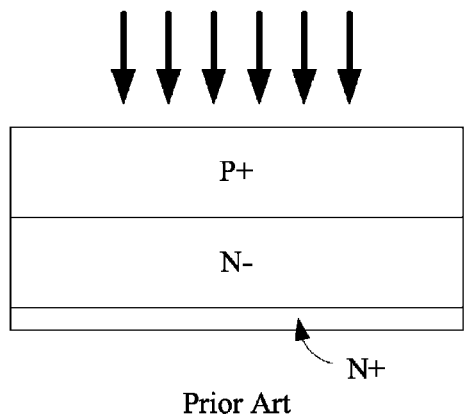
FIG. 1 is a cross-sectional drawing of a prior art photovoltaic cell.

A conventional prior art photovoltaic cell includes a p–n diode; an example is shown in FIG. 1. A depletion zone forms at the p–n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a n−/p+ junction (as shown in FIG. 1) or a p−/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
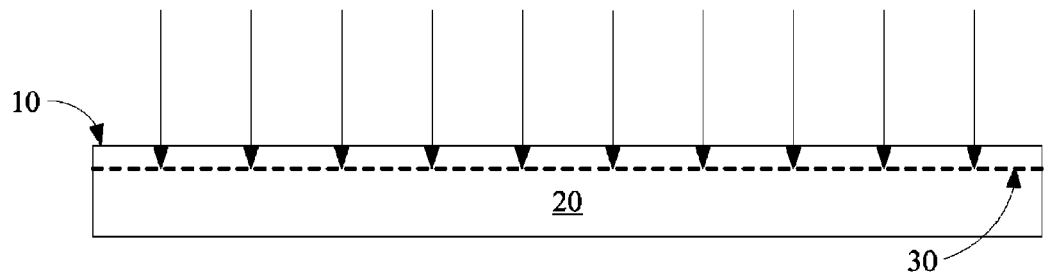
FIGS. 2a-2d are cross-sectional drawings of stages of fabrication of a photovoltaic cell formed according to an embodiment of Sivaram et al.
Figure 2B:
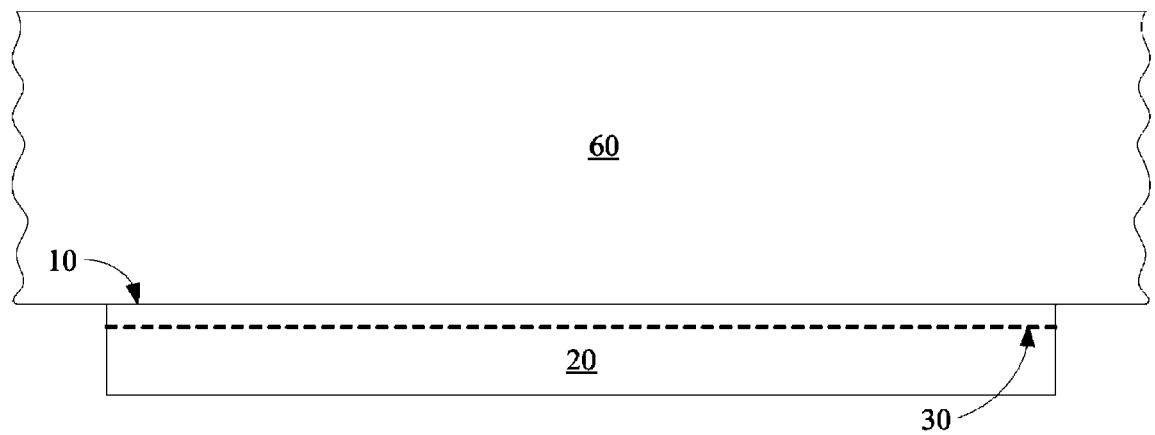
Figure 2C:
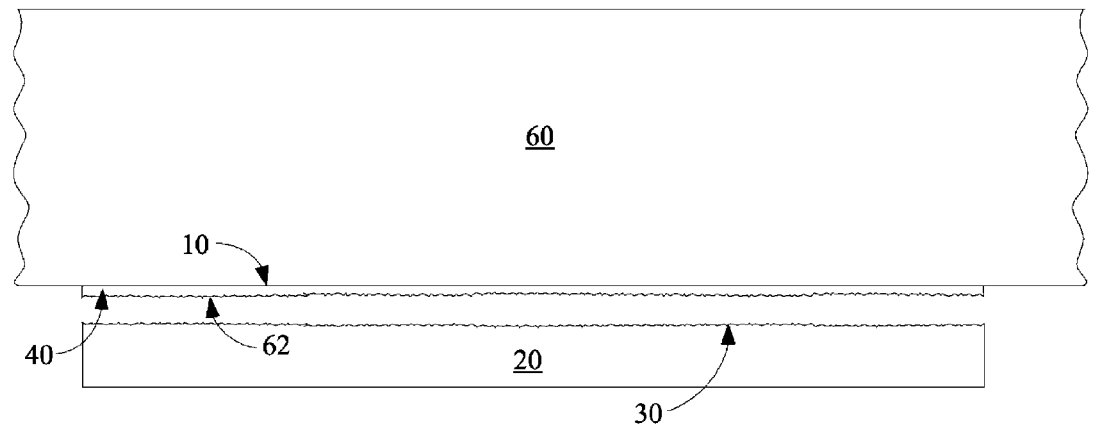
Figure 2D:
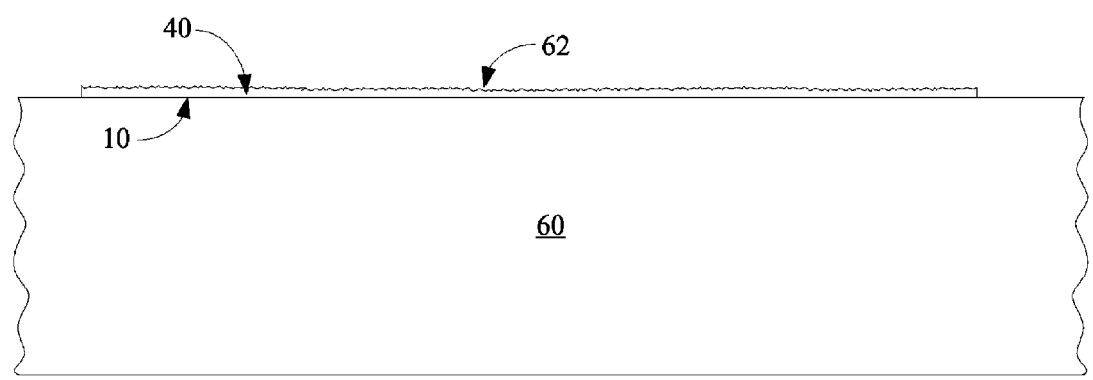

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., rather than being formed from sliced wafers, photovoltaic cells are formed of thin semiconductor laminae without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

Ion implantation through a first surface in monocrystalline silicon creates a cleave plane defined by damage in the silicon matrix, where there is a peak of damage at or near the depth of maximum ion concentration. Exfoliation propagates along the plane of peak damage. Following exfoliation, then, there will be damaged silicon at the second surface created by exfoliation. This damaged silicon has undesirable electrical properties, including increased recombination of free carriers and decreased carrier mobility, which will adversely affect cell efficiency.

The technique of implanting hydrogen ions into silicon to define a damage plane, then exfoliating a thin silicon layer at the damage plane, has been used to form silicon-on-insulator (SOI) semiconductor devices. During fabrication of SOI devices, a damaged silicon surface is also created. Generally this damage can be repaired by annealing, removed by CMP, or both.

Referring to FIG. 2*c*, recall that during exfoliation of lamina 40 from donor wafer 20 using the methods of Sivaram et al., creating the damaged second surface 62, lamina 40 is attached to a receiver element 60. Many materials can be used for receiver element 60, including borosilicate glass, soda-lime glass, semiconductor, metals, polymers, etc. In many embodiments, one or more layers may be disposed between receiver element 60 and lamina 40. These layers may include a wide variety of conductive materials, including titanium, titanium nitride, silver, aluminum, etc. Some of the materials which may be used for receiver element 60 and the intervening conductive materials can readily tolerate high temperature, while for others, exposure to high temperature must be limited or avoided. Thus it may be necessary to limit or avoid use of a high-temperature anneal to repair damaged silicon at second surface 62. In contrast, in SOI devices, the materials present in the structure following exfoliation typically are silicon and silicon dioxide only, both of which can tolerate very high temperature.

During fabrication of SOI devices, annealing to repair damage may be followed by a CMP step to create a pristine, planar surface, which is generally desirable for semiconductor applications. The cost of a CMP step can readily be absorbed in fabrication of semiconductor devices, but may be prohibitive in fabrication of photovoltaic devices. Further, in photovoltaic cells, surface roughness may reduce reflection of incident light, and thus may be desirable. In short, the damage removal techniques employed in SOI fabrication generally are not applicable in the fabrication of photovoltaic cells.

Figure 3A:
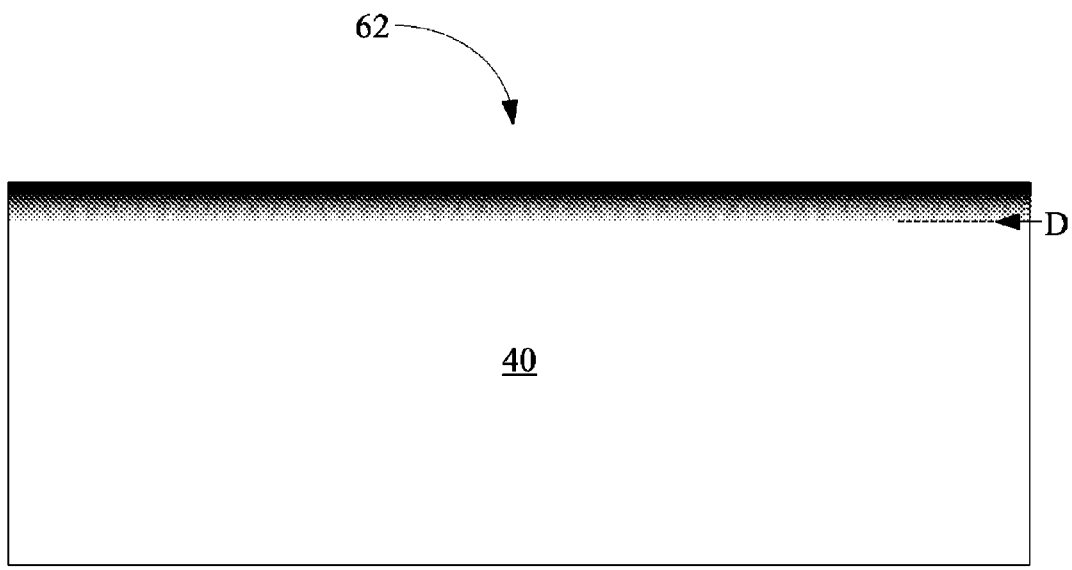
FIGS. 3a and 3b are cross-sectional drawings illustrating removal of damaged silicon from a crystalline silicon surface according to an embodiment of the present invention.
Figure 3B:
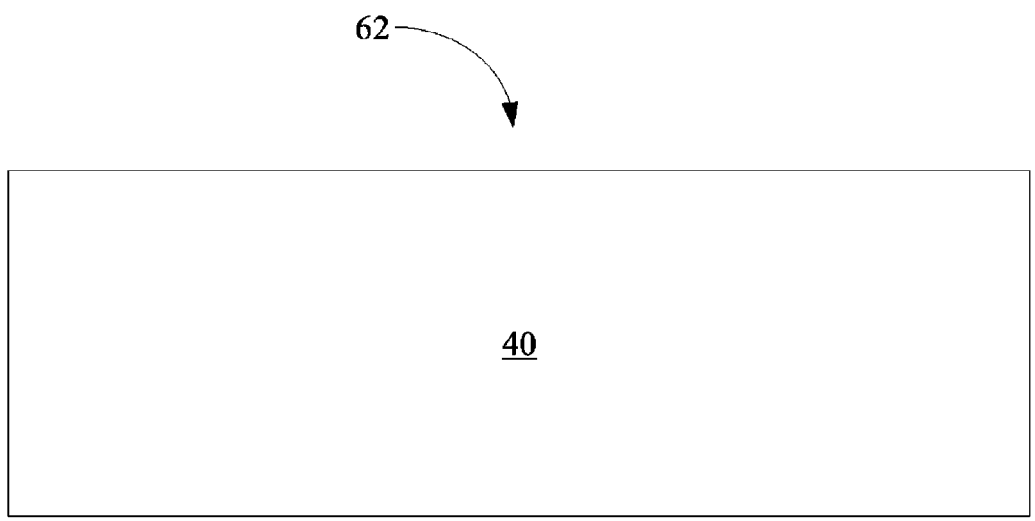

Referring to FIG. 3*a*, there is damaged silicon at second surface 62 of lamina 40 created by implant and exfoliation. Note this figure is vertically exaggerated for visibility. As indicated by shading in FIG. 3*a*, typically the concentration of damage is highest at the exfoliated surface 62, and decreases with depth to a depth D in the body of lamina 40. From this depth onward, the degree of damage is small and largely uniform. Note that some damage from ion implantation may be present throughout the thickness of lamina 40. The most heavily damaged silicon is to be removed, while removing as little as possible of the remaining less-damaged silicon. In the present invention, damaged second surface 62 is exposed to a selective etchant having an etch rate which is positively correlated with the concentration of structural defects in the silicon. Etching proceeds most quickly in the most heavily damaged silicon at or near second surface 62 when etching begins following cleaving. With depth from this surface, the degree of damage decreases, and the etch rate slows, eventually slowing sharply once less-damaged silicon is exposed past the exfoliation region, as shown in FIG. 3*b*.

It may be useful to compare the etch rate at the most heavily damaged surface 62 to a relatively undamaged surface, for example first surface 10 (see FIG. 2*a*). In most embodiments, during etching at second surface 62, first surface 10 is bonded to receiver element 60 (see FIG. 2*c*) and is not accessible at that time for etching. If first surface 10 were exposed, however, the etch rate at second surface 62 when etching begins following cleaving is at least two times more than the etch rate at first surface 10. In most embodiments, the etchant has higher selectivity, and the etch rate at second surface 62 may be three times, five times, ten times, or even twenty or thirty times, or more, greater than at first surface 10. Highly selective etchants can be chosen such that etching nearly stops when significantly less damaged silicon is exposed.

With a highly selective etchant, the surface remaining following etch is not perfectly planar; rather, it approximates the surface that defines the original interface between severely damaged and less damaged silicon. For a photovoltaic cell, surface irregularity or roughness tends to reduce reflection of incident light and increase internal reflection, both of which may be desirable.

Thus damaged silicon can be removed at a silicon surface by a method comprising: defining a cleave plane in a substantially crystalline silicon body by implanting ions through a first surface of the silicon body; cleaving a silicon lamina from the silicon body at the cleave plane, wherein the first surface of the silicon body is a first surface of the lamina, and wherein the cleaving step creates a second surface of the silicon lamina opposite the first surface; and etching at the second surface using a selective etchant, wherein the selective etchant etches silicon at a variable rate, wherein the etch rate in silicon is positively correlated with the concentration of structural defects in the silicon.

Damaged silicon could be removed by a non-selective timed etch, but such an etch is more difficult to control. Etching for too short a time will leave some damaged silicon, while overetch removes too much silicon in an already-thin lamina. The selective etch of the present invention rapidly removes damaged silicon, and, depending on the etchant selected, slows or all but stops upon reaching relatively undamaged monocrystalline silicon. This selective etch is easily controlled and highly robust in a production environment.

For clarity, a detailed example of a photovoltaic assembly including a receiver element and a lamina having thickness between 0.2 and 100 microns, in which damaged silicon is removed from a surface created by exfoliation using a selective etch, according to embodiments of the present invention, will be provided. For completeness, many materials, conditions, and steps will be described. It will be understood, however, that many of these details can be modified, augmented, or omitted while the results fall within the scope of the invention.

EXAMPLE

The process begins with a donor body of an appropriate semiconductor material. An appropriate donor body may be a monocrystalline silicon wafer of any practical thickness, for example from about 200 to about 1000 microns thick. In alternative embodiments, the donor wafer may be thicker; maximum thickness is limited only by practicalities of wafer handling. Alternatively wafers or ingots of other semiconductor materials, including germanium, silicon germanium, or III-V or II-VI semiconductor compounds such as GaAs, InP, etc., may be used. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 4A:
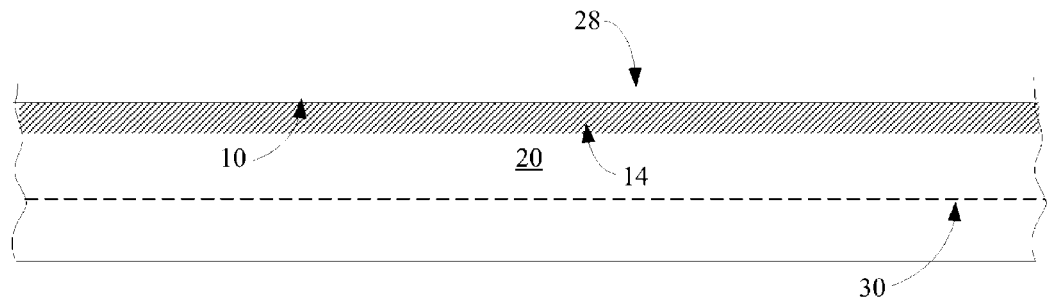
FIGS. 4a-4e illustrate stages in formation of a photovoltaic cell according to an embodiment of the present invention.

Referring to FIG. 4a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1 \times 10^{15}$ and about $1 \times 10^{18}$ dopant atoms/cm$^3$, for example about $1 \times 10^{17}$ dopant atoms/cm$^3$. The fact that donor wafer 20 can be reused for some other purpose following exfoliation of one or more laminae makes the use of higher-quality silicon economical.

First surface 10 of donor wafer 20 may be substantially planar, or may have some preexisting texture. If desired, some texturing or roughening of first surface 10 may be performed, for example by wet etch or plasma treatment. Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Methods to create surface roughness are described in further detail in Petti, U.S. patent application Ser. No. 12/130,241, "Asymmetric Surface Texturing For Use in a Photovoltaic Cell and Method of Making," filed May 30, 2008; and in Herner, U.S. patent application Ser. No. 12/343,420, "Method to Texture a Lamina Surface Within a Photovoltaic Cell," filed Dec. 23, 2008, both owned by the assignee of the present application and both hereby incorporated by reference.

First surface 10 may be heavily doped to some depth to the same conductivity type as wafer 20, forming heavily doped region 14; in this example, heavily doped region 14 is n-type. As wafer 20 has not yet been affixed to a receiver element, high temperatures can readily be tolerated at this stage of fabrication, and this doping step can be performed by any conventional method, including diffusion doping. Any conventional n-type dopant may be used, such as phosphorus or arsenic. Dopant concentration may be as desired, for example at least $1 \times 10^{18}$ dopant atoms/cm$^3$, for example between about $1 \times 10^{18}$ and $1 \times 10^{21}$ dopant atoms/cm$^3$. Doping and texturing can be performed in any order, but since most texturing methods remove some thickness of silicon, it may be preferred to form heavily doped n-type region 14 following texturing.

Next a dielectric 28 is formed on first surface 10. As will be seen, in the present example first surface 10 will be the back of the completed photovoltaic cell, and a reflective, conductive material is to be formed on the dielectric layer. The reflectivity of the conductive layer to be formed is enhanced if dielectric layer 28 is relatively thick. For example, if dielectric layer 28 is silicon dioxide, it may be between about 1000 and about 1500 angstroms thick, while if dielectric layer 28 is silicon nitride, it may be between about 700 and about 800 angstroms thick, for example about 750 angstroms. This layer may be grown or deposited by any suitable method. A grown oxide or nitride layer 28 passivates first surface 10 better than if this layer is deposited. In some embodiments, a first thickness of layer 28 may be grown, while the rest is deposited.

In the next step, ions, preferably hydrogen or a combination of hydrogen and helium, are implanted through dielectric layer 28 into wafer 20 to define cleave plane 30, as described earlier. The cost of this hydrogen or helium implant may reduced by methods described in Parrill et al., U.S. patent application Ser. No. 12/122,108, "Ion Implanter for Photovoltaic Cell Fabrication," filed May 16, 2008, owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 microns.

Figure 4B:
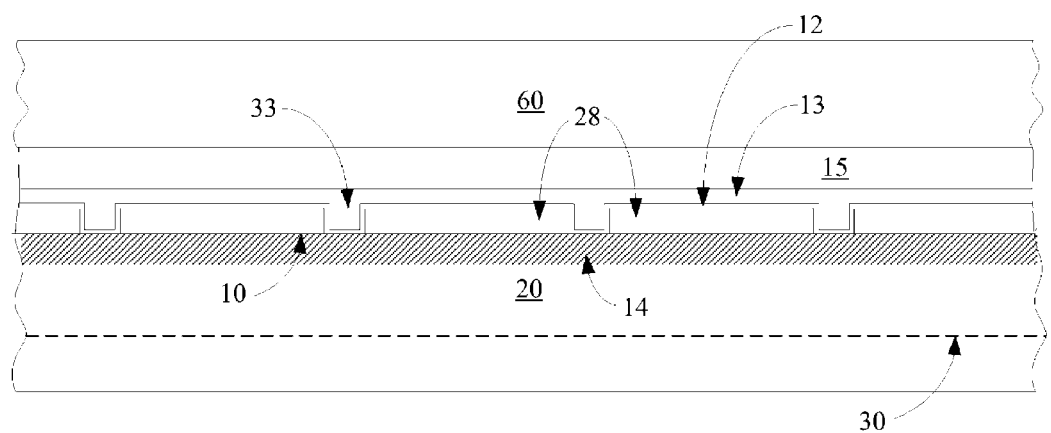

Turning to FIG. 4b, after implant, openings 33 are formed in dielectric 28 by any appropriate method, for example by laser scribing or screen printing. The size of openings 33 may be as desired, and will vary with dopant concentration, metal used for contacts, etc. In one embodiment, these openings may be about 40 microns square. Note that figures are not to scale.

Next a conductive layer or stack of conductive layers is deposited on dielectric layer 28, filling openings 33 and contacting heavily doped region 14 at first surface 10. A wide variety of materials or stacks of materials may be used, including tantalum, titanium, titanium nitride, aluminum, silver, copper, titanium, chromium, molybdenum, zirconium, vanadium, indium, cobalt, antimony, or tungsten, or alloys thereof. In the embodiment of FIG. 4b, this stack begins with a thin layer 12 of titanium. Thin titanium layer 12 may be between about 50 and about 700 angstroms, for example about 100 angstroms. Next is a layer 13 of titanium nitride, which may be any suitable thickness, for example between about 100 angstroms and about 1000 angstroms. A third, thicker layer 15 of titanium completes the stack. Titanium layer 15 may be as desired, for example, from about 700 angstroms up to about one micron or more. Titanium and titanium nitride are both refractory materials. In this example, the stack of conductive layers consists solely of refractory materials. In other embodiments, other conductive layers or stacks of conductive layers may be used instead.

Next, wafer 20 is affixed to a receiver element 60, with dielectric layer 28, thin titanium layer 12, titanium nitride layer 13, and thicker titanium layer 15 intervening. Receiver element 60 may be any suitable material, including glass, such as soda-lime glass or borosilicate glass; a metal or metal alloy such as stainless steel or aluminum; a polymer; or a semiconductor, such as metallurgical grade silicon. The wafer 20, receiver element 60, and intervening layers are bonded by any suitable method. If receiver element 60 is soda-lime glass, anodic bonding may be advantageous. In some embodiments, receiver element 60 has a widest dimension no more than about twenty percent greater than the widest dimension of wafer 20, and in most embodiments the widest dimension may be about the same as that of wafer 20. In other embodiments, receiver element 60 is significantly larger than wafer 20, and additional donor wafers may be bonded to the same receiver element.

Figure 4C:
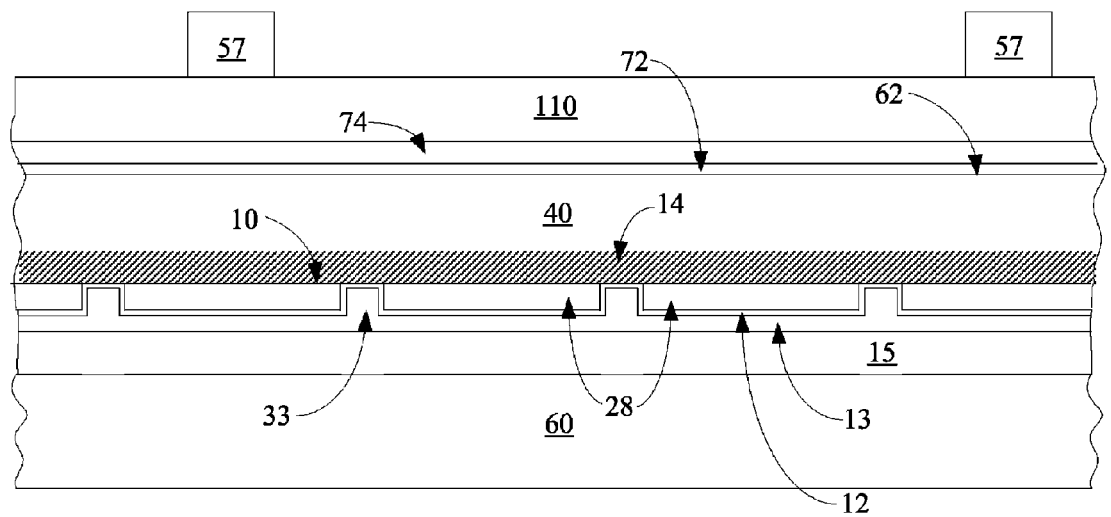

Referring to FIG. 4c, which shows the structure inverted with receiver element 60 on the bottom, a thermal step causes lamina 40 to cleave from donor wafer 20 at the cleave plane. In some embodiments, this cleaving step may be combined with a bonding step. Cleaving is achieved in this example by exfoliation, which may be achieved at temperatures between, for example, about 350 and about 650 degrees C. In general exfoliation proceeds more rapidly at higher temperature. Exfoliation temperatures below 600 degrees C., for example between about 450 and 550 degrees C., may reduce unwanted dopant diffusion. The thickness of lamina 40 is determined by the depth of cleave plane 30. In many embodiments, the thickness of lamina 40 is between about 1 and about 10 microns, for example between about 2 and about 5 microns. Bonding and exfoliation may be achieved using methods described in Agarwal et al., U.S. patent application Ser. No. 12/335,479, "Methods of Transferring a Lamina to a Receiver Element," filed Dec. 15, 2008, owned by the assignee of the present application and hereby incorporated by reference.

Second surface 62 has been created by exfoliation. Ion implantation creates damage at various depths from first surface 10, the surface through which the ions were implanted. A peak of damage occurs at a depth which corresponds to the cleave plane. Following exfoliation, second surface 62 is created at the cleave plane. An uneven thickness of damaged silicon remains near second surface 62, as shown in FIG. 3a. As indicated schematically in FIG. 3a, damage is generally most severe at the surface, decreasing with depth through a heavily damaged region, with substantially less damage in the body of lamina 40. Note that because ions are implanted through lamina 40, there will be some degree of damage throughout the lamina. The heavily damaged silicon near second surface 62 has poor electrical properties, and, if not removed or treated, will significantly reduce cell efficiency. The quality of silicon can be measured by the concentration of charge carriers and the mobility of these carriers; ideally these are maximized. As damage is removed or repaired, carrier concentration and mobility will increase.

As described earlier, in embodiments of the present invention, damaged silicon is removed at second surface 62, created by exfoliation, by exposing that surface to a selective etch, where the etchant has a significantly higher etch rate for severely damaged silicon than for less-damaged or undamaged silicon. When exposed to this selective etchant, severely damaged silicon will be etched away relatively quickly. When damaged silicon has been removed by this etchant and only lightly damaged silicon remains, the etchant will generally continue to etch the remaining silicon, but more slowly.

Depending on the etchant selected, the etch rate for the most heavily damaged silicon, for example at second surface 62 when etching begins following cleaving, is at least two times greater than the etch rate for a relatively undamaged surface, for example at first surface 10, if it were exposed. For example, the etch rate at second surface 62 may be three, five, eight or ten times greater than for relatively undamaged silicon, like at first surface 10, and for some selective etchants may be twenty or thirty times greater, or more.

It will be appreciated by those skilled in the art that what is conventionally described as monocrystalline silicon in fact nearly always includes some defects or impurities. Impurities may include well-known conductivity-enhancing dopants such as phosphorus, arsenic, antimony, boron, aluminum, etc., as well as other impurities which typically occur in production environments.

A variety of etchants having a range of selectivity may be used to remove damaged silicon at second surface 62. In some embodiments, an etchant including acetic acid, hydrofluoric acid, and nitric acid may be used. The acetic acid:hydrofluoric acid:nitric acid ratios may be adjusted as desired; for example ratios may range between 60:1:1 and 20:5:5. In one embodiment, the etchant may include acetic acid, hydrofluoric acid, and nitric acid in a ratio of 40:1:2. Other components may be included as well. For example, the etchant may include one or more components selected from the group consisting of hydrofluoric acid, nitric acid, water, phosphoric acid, and acetic acid.

The thickness of the heavily damaged silicon may not be uniform, and will vary with the depth of the implant. For example, for an implant yielding a lamina having a thickness of about 1.3 microns, about 250 nm of heavily damaged silicon may be removed by a selective etch, yielding a lamina having high enough carrier concentration and mobility to fabricate an adequate photovoltaic cell. A deeper implant yielding a thicker lamina will likely have a different damage profile.

The damaged surface can be exposed to the etchant using a variety of methods. A 40:1:2 solution of acetic, hydrofluoric, and nitric acid will remove about 250 nm of damaged silicon in about 50 seconds at room temperature. The same solution will remove about 500 nm of damaged silicon in about 100 seconds at room temperature. Increasing temperature will generally increase the etch rate and thus reduce etch time. Note, however, that the selectivity of the etch means that precise time control is not required, as the etch will slow as it reaches less damaged silicon. Etching may be performed by a variety of methods, for example by dipping single wafers in a solution, dipping a cassette of wafers in a solution, moving wafers on a belt exposing the surface to be etched to the etchant, etc.

The surface between the region of heavily damaged silicon and of the less damaged silicon in the body of lamina 40 is unlikely to be perfectly planar; thus some texture is likely to remain following the selective damage etch of the present invention, particularly with higher selectivity. In some embodiments a texturing etch may be combined with the damage-removal etch. In other embodiments a texturing etch may follow the damage-removal etch.

It has been noted that while the peak of damage defines the plane along which the lamina exfoliates, implant causes some lattice damage through the entire lamina. In some embodiments, an anneal may be performed, for example following the selective etch, to repair implant damage within the body of lamina 40. Annealing may be performed, for example, at 500 degrees C. or greater, for example at 550, 600, 650, 700 degrees C. or greater. In one example, the structure is annealed at about 650 degrees C. for about 45 minutes. In other embodiments, no damage anneal is performed.

Still referring to FIG. 4c, if an anneal was performed, an oxide may form on second surface 62 which may be removed by any conventional cleaning step, for example an HF dip. After cleaning, in the present embodiment a thin layer 72 of intrinsic amorphous silicon is deposited on second surface 62. Layer 72 may be, for example, about 30 to 100 angstroms thick. In some embodiments intrinsic amorphous layer 72 may be omitted. A layer 74 of heavily doped amorphous silicon is formed on layer 72, and may be, for example, about 200 angstroms thick. In general, the combined thickness of layers 72 and 74 will be between about 200 and about 350 angstroms, for example about 250 angstroms. Both amorphous silicon layers 72 and 74 are formed by any convention method, for example plasma enhanced chemical vapor deposition (PECVD). In this example, heavily doped amorphous layer 74 is doped p-type, opposite the conductivity type of lightly doped n-type lamina 40, and serves as the emitter of the photovoltaic cell being formed, while lightly doped n-type lamina 40 comprises the base region.

A transparent conductive oxide (TCO) layer 110 is formed on heavily doped amorphous layer 74. Appropriate materials for TCO 110 include indium tin oxide, as well as aluminum-doped zinc oxide, tin oxide, titanium oxide, etc.; this layer may be, for example, about 1000 angstroms thick, and serves as both a top electrode and an antireflective layer. In alternative embodiments, an additional antireflective layer (not shown) may be formed on top of TCO 110.

Figure 4D:
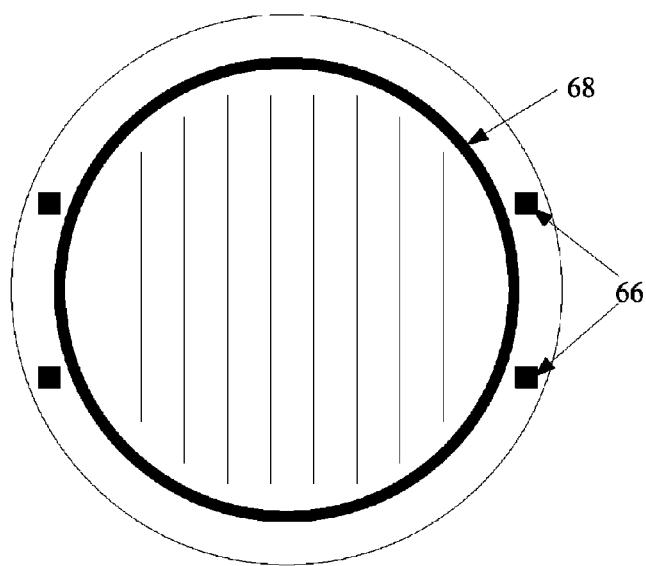

A photovoltaic cell has been formed, including lightly doped n-type lamina 40, which comprises the base of the cell, and heavily doped p-type amorphous layer 74, which serves as the emitter of the cell. Heavily doped n-type region 14 will improve electrically contact to the cell. Electrical contact must be made to both faces of the cell. This contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference. If the methods of the '064 application are employed, for example, gridlines 57 (formed by any suitable method) make electrical contact to heavily doped p-type amorphous silicon layer 74 by way of TCO 110, while contact is made to the base of the cell by way of heavily doped n-type layer 14. Referring to FIG. 4d, the upper surface of the lamina may be contacted through vias 66, which traverse lamina 40. Trench 68 cuts through at least TCO layer 110 and heavily doped p-type amorphous silicon layer 74, providing electrical isolation.

Figure 4E:
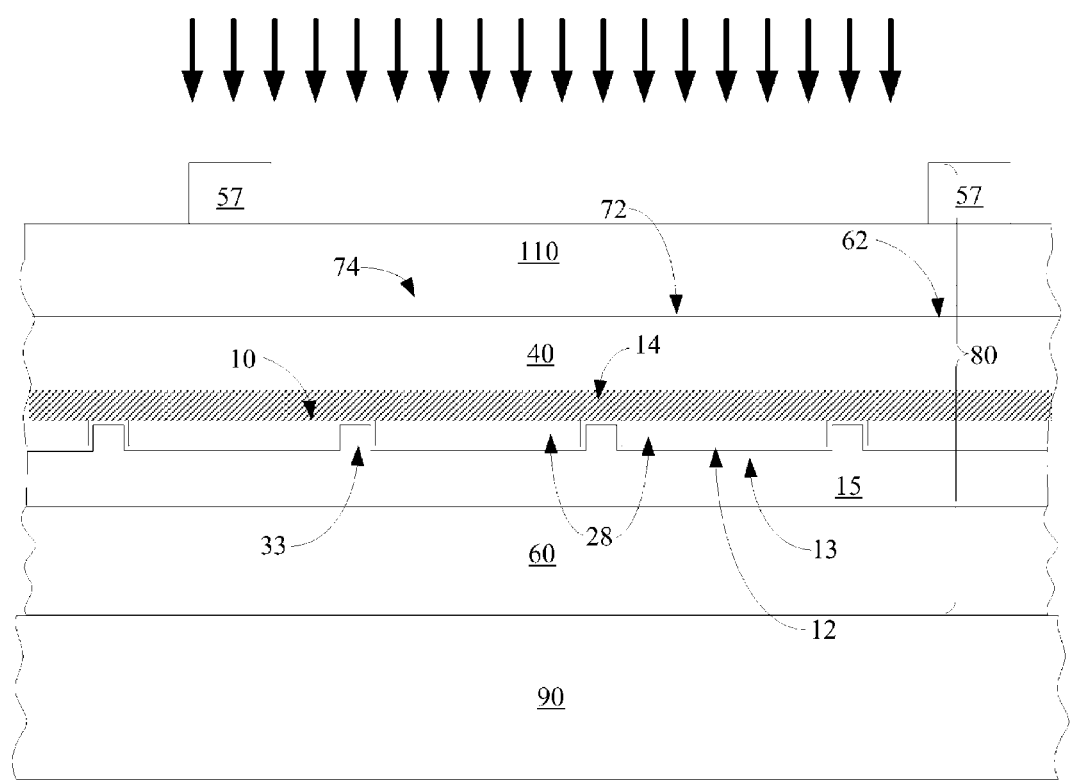

FIG. 4e shows completed photovoltaic assembly 80, which includes a photovoltaic cell and receiver element 60. The cell includes a base, lightly doped n-type body of lamina 40, and the emitter, heavily doped p-type amorphous silicon layer 74. Heavily doped n-type region 14 provides electrical contact to the base. In alternative embodiments, the emitter may be at the back of the cell rather than the front. Incident light (indicated by arrows) falls on TCO 110, enters the cell at heavily doped p-type amorphous silicon layer 74, enters lamina 40 at second surface 62, travels through lamina 40, and most or all of this light is reflected back into the cell by the combination of dielectric layer 28 and the reflective conductive layer, in this embodiment titanium layer 12. In this embodiment, receiver element 60 serves as a substrate. If receiver element 60 has, for example, a widest dimension about the same as that of lamina 40, the receiver element 60 and lamina 40, and associated layers, form a photovoltaic assembly 80. Multiple photovoltaic assemblies 80 can be formed and affixed to a supporting substrate 90 or, alternatively, a supporting superstrate (not shown).

In alternative embodiments, receiver element 60 may have a substantially larger surface dimension than lamina 40. During fabrication multiple donor wafers may have been bonded to a single receiver element 60, which will then itself serve as the supporting substrate or superstrate of a photovoltaic module. In still other embodiments, smaller numbers of laminae 40 may be affixed to a receiver element 60, forming submodules which will be combined into a larger photovoltaic module. Photovoltaic cells making up a photovoltaic module are typically connected electrically in series.

This example of fabrication of a photovoltaic cell, in which the photovoltaic cell includes a lamina having a surface created by exfoliation and treated using a selective etch to remove damaged silicon, was provided for completeness and clarity. Clearly this selective etch to remove damaged silicon can be used in many different types of photovoltaic cells, such as those described in the Sivaram et al. application earlier incorporated, and, for example, cells described in Hilali et al., U.S. patent application Ser. No. 12/399,065, "Photovoltaic Cell Comprising an MIS-Type Tunnel Diode," filed Mar. 6, 2009; and Hilali et al, U.S. patent application Ser. No. 12/189,157, "Photovoltaic Cell Comprising a Thin Lamina Having Low Base Resistivity and Method of Making," filed Aug. 10, 2008, both owned by the assignee of the present application and both incorporated by reference; or in any other appropriate context.

What has been described is a method to form a photovoltaic cell, the method comprising: defining a cleave plane in a substantially crystalline silicon body by implanting ions through a first surface of the silicon body; affixing the silicon body at the first surface to a receiver element, with zero, one, or more layers intervening; cleaving a silicon lamina from the silicon body at the cleave plane, wherein the first surface of the silicon body is a first surface of the lamina, and wherein the cleaving step creates a second surface of the silicon lamina opposite the first surface; etching at the second surface using a selective etchant, wherein the selective etchant etches silicon at a variable rate, wherein the etch rate in silicon is positively correlated with the concentration of structural defects in the silicon; and fabricating a photovoltaic cell, the photovoltaic cell comprising the silicon lamina. There may be zero, one, or more layers intervening between the first surface and the receiver element. These layers may include a conductive layer or a conductive stack.

The utility of the selective etch of the present invention to remove heavily damaged silicon from a surface created by implant and exfoliation as described is not limited to fabrication of photovoltaic cells. The methods described herein could be used, for example, in fabrication of SOI devices or other devices.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to remove damaged silicon at a silicon surface, the method comprising:
   defining a cleave plane in a substantially crystalline silicon body by implanting ions through a first surface of the silicon body;
   before the defining step, heavily doping the first surface of the silicon body to a first conductivity type;
   cleaving a silicon lamina from the silicon body at the cleave plane, wherein the first surface of the silicon body is a first surface of the lamina, and wherein the cleaving step creates a second surface of the silicon lamina opposite the first surface; and
   etching at the second surface using a selective etchant, wherein the selective etchant etches silicon at a variable rate, wherein the etch rate in silicon is positively correlated with the concentration of structural defects in the silicon.

2. The method of claim 1 wherein the etch rate of silicon at the second surface when etching begins following cleaving is at least two times faster than the etch rate of silicon at the first surface.

3. The method of claim 1 further comprising, before the cleaving step, affixing the silicon body to a receiver element at the first surface, with zero, one, or more layers intervening between the first surface and the receiver element, wherein, following the cleaving step, the silicon lamina remains affixed to the receiver element.

4. The method of claim 3 wherein a conductive layer or conductive stack is disposed between the silicon lamina and the receiver element.

5. The method of claim 1 wherein the etchant comprises acetic acid, hydrofluoric acid, and nitric acid.

6. The method of claim 5 wherein the etchant comprises acetic acid, hydrofluoric acid, and nitric acid in compositions having ratios between 60:1:1 and 20:5:5.

7. The method of claim 1 wherein the etchant comprises one or more components selected from the group consisting of: hydrofluoric acid, nitric acid, water, phosphoric acid, and acetic acid.

8. The method of claim 1 wherein the silicon body is undoped or lightly doped to the first conductivity type.

9. A method to form a photovoltaic cell, the method comprising:
   defining a cleave plane in a substantially crystalline silicon body by implanting ions through a first surface of the silicon body;
   affixing the silicon body at the first surface to a receiver element, with zero, one, or more layers intervening;
   cleaving a silicon lamina from the silicon body at the cleave plane, wherein the first surface of the silicon body is a first surface of the lamina, and wherein the cleaving step creates a second surface of the silicon lamina opposite the first surface;
   etching at the second surface using a selective etchant, wherein the selective etchant etches silicon at a variable rate, wherein the etch rate in silicon is positively correlated with the concentration of structural defects in the silicon; and
   fabricating a photovoltaic cell, the photovoltaic cell comprising the silicon lamina.

10. The method of claim 9 wherein the etch rate of silicon at the second surface when etching begins following cleaving is at least five times faster than the etch rate of silicon at the first surface.

11. The method of claim 9 wherein a conductive layer or stack of conductive layers is disposed between the silicon lamina and the receiver element.

12. The method of claim 11 wherein the stack of conductive layers comprises refractory materials.

13. The method of claim 11 wherein the stack of conductive layers consists of refractory materials.

14. The method of claim 11 wherein the conductive stack comprises titanium and titanium nitride.

15. The method of claim 9 further comprising, following the etching step, annealing the lamina at a temperature exceeding about 500 degrees C.

16. The method of claim 9 wherein the ions comprise hydrogen and/or helium ions.

17. The method of claim 9 wherein the etchant comprises acetic acid, hydrofluoric acid, and nitric acid.

18. The method of claim 17 wherein the etchant comprises acetic acid, hydrofluoric acid, and nitric acid in compositions having ratios between 60:1:1 and 20:5:5.

19. The method of claim 9 wherein the etchant comprises one or more components selected from the group consisting of: hydrofluoric acid, nitric acid, water, phosphoric acid, and acetic acid.

20. The method of claim 9 further comprising, before the defining step, heavily doping the first surface of the silicon body to a first conductivity type.

21. The method of claim 9 wherein the fabricating step comprises depositing amorphous silicon on the second surface.

22. The method of claim 21 wherein at least a portion of the amorphous silicon layer is heavily doped to a first conductivity type.

23. The method of claim 22 wherein the silicon lamina is undoped or lightly doped to a second conductivity type opposite the first.

24. The method of claim 9 wherein the silicon lamina substantially comprises a base region of the photovoltaic cell.

* * * * *